United States Patent
Lazar et al.

(10) Patent No.: US 8,358,131 B2
(45) Date of Patent: Jan. 22, 2013

(54) RF STRIPLINE ANTENNA WITH IMPEDANCE ADAPTATION FOR MR IMAGING

(75) Inventors: Razvan Lazar, Erlangen (DE); Juergen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 391 days.

(21) Appl. No.: 12/718,271

(22) Filed: Mar. 5, 2010

(65) Prior Publication Data
US 2010/0225320 A1  Sep. 9, 2010

(30) Foreign Application Priority Data
Mar. 6, 2009  (DE) .......... 10 2009 012 107

(51) Int. Cl.
*G01V 3/30*   (2006.01)
*G01R 33/32*  (2006.01)
*A61B 6/00*   (2006.01)
(52) U.S. Cl. ........ 324/318; 324/307; 324/322; 600/422; 600/425

(58) Field of Classification Search .......... 324/300–322; 600/407–464
See application file for complete search history.

(56) References Cited

U.S. PATENT DOCUMENTS

| | | | | |
|---|---|---|---|---|
| 5,208,537 | A | * | 5/1993 | Rietsch et al. ................ 324/322 |
| 5,708,361 | A | * | 1/1998 | Wang et al. .................. 324/318 |
| 6,160,400 | A | * | 12/2000 | Friedrich et al. ............. 324/322 |
| 6,943,551 | B2 | | 9/2005 | Eberler et al. |
| 2004/0217761 | A1 | | 11/2004 | Wong et al. |
| 2005/0127914 | A1 | | 6/2005 | Eberler et al. |
| 2009/0027054 | A1 | * | 1/2009 | Biber et al. .................. 324/318 |

OTHER PUBLICATIONS

"Non-resonant Microstrip (NORM) RF Coils: An Unconventional RF Solution to MR Imaging and Spectroscopy," Zhang et al, Proc. Intl. Soc. Mag. Reson. Med., vol. 16 (2008) p. 435.
"Bildgebende Systeme für die medizinische Diagnostik," Krestel, pp. 520-521.

* cited by examiner

*Primary Examiner* — Jermele M Hollington
*Assistant Examiner* — Emily Chan
(74) *Attorney, Agent, or Firm* — Schiff Hardin LLP

(57) ABSTRACT

The efficiency and the field structure of an antenna arrangement for a magnetic resonance tomography apparatus are improved by at least one impedance transformation circuit connected with the antenna.

13 Claims, 3 Drawing Sheets

RF STRIPLINE ANTENNA WITH IMPEDANCE ADAPTATION FOR MR IMAGING

BACKGROUND OF THE INVENTION

1. Field of the Invention

The invention concerns an antenna arrangement for a magnetic resonance apparatus.

2. Description of the Prior Art

Magnetic resonance apparatuses for the examination of patients, in particular by magnetic resonance tomography, are generally known, for example from DE10314215B4.

Modern magnetic resonance systems (also called MR or MRT systems) normally operate with multiple different antennas (also called coils in the following) to emit radio-frequency pulses for nuclear magnetic resonance excitation and/or to receive induced magnetic resonance signals. A magnetic resonance system frequently has a larger coil, known as a whole-body coil (also called a body coil), that is normally permanently installed in the apparatus, as well as multiple small local coils (also called surface coils). In contrast to the whole-body coil, the local coils serve to acquire detailed images of body parts or, respectively, organs of a patient that are located relatively close to the body surface. For this purpose, the local coils are applied directly at the point of the patient at which the region to be examined is located.

Antennas having what is known as a "transmission line" shape (for example in an open or more closed stripline style) with application in MR imaging are generally known. A very particular type of this antenna shape is taken by what is known as the aperiodic antenna, in which the structure is not resonant but rather represents a transmission line that is terminated correctly in terms of impedance at its end. The impedance termination (termination with an impedance resistor) leads to the situation that no standing wave forms along the antenna. The reflection-free, terminated conductor with its characteristic impedance, which conductor serves as an antenna structure, is traversed by an advancing wave, and the field that is relevant for the imaging is generated evanescently (as a field decaying with increasing distance from the conductor) by the current flowing in the antenna structure without any resonance step-up in the immediate proximity of the conductor.

In the reception mode, the antenna functions reciprocally relative to the transmission phase in that the reflection-free terminated conductor receives MR relaxation signals arising in its surroundings without resonance step-up and transfers them for further processing to the preamplifier connected with it with correct (matched) impedance.

In the following an element of an MR antenna is generally discussed. An MR antenna arrangement typically consists of an entire series of such antenna elements that are arranged around the volumes to be examined. The type and the design of the arrangement can be different. Via a suitable chaining of such antenna elements, either planar structures (planar coils) or those that surround the volume to be examined (volume coils) can be built. In the transmission case, all antenna elements are thereby fed separately with correct phase, and in the reception case the antenna elements are connected by separate preamplifiers with the receiver of the MR system under consideration of the phase relationships.

The advantages of this antenna shape are low costs, simplicity, and due to the spatially limited antenna characteristic, adjacent elements couple only very weakly with one another, and thus the chaining of multiple such antenna elements in 50 ohm engineering is very simple (array formation). Another advantage is broadband capability (with regard to the spectroscopy of interest). Moreover, due to the broadband capability, all calibration and tuning tasks that otherwise would be necessary for a resonant antenna are not needed.

A disadvantage of this antenna form is lower efficiency, because the largest portion of the RF power generated by the amplifier is dissipated (released) thermally by the termination resistors in the transmission case and does not contribute to the generation of the B1 field that is necessary for the imaging. An additional cause of the low efficiency is the limited reflux [return] space that is necessary to achieve the comparably low characteristic impedance of 50 ohms of the transmission line.

Another disadvantage is limited antenna characteristic.

The B1 field generated by such an antenna in the transmission phase is limited to the immediate area in proximity to the antenna structure (the evanescent field of the transmission line that directly penetrates the conductor structure in the adjacent medium). In the reception mode, the signal yield is limited to a superficial region in proximity to the antenna structure due to the same, limited antenna characteristic.

The antenna form has previously always been used with a transmission line that is adapted to the common 50 ohm impedance of the RF portion of the MR system. A very simple design is thereby achieved because the antenna (that now has 50 ohm ports) can be connected directly to the system. Complicated modifications are thus omitted. (See ISMRM Abstract #435 of 2008.) However, the use of a 50 ohm transmission line as an antenna element also entails disadvantages.

SUMMARY OF THE INVENTION

An object of the present invention is to avoid these disadvantages while simultaneously retaining the advantages of this antenna form.

This object is achieved in accordance with the invention by an antenna arrangement for a magnetic resonance tomography apparatus that has an antenna and at least one impedance transformation circuit connected with the antenna.

The impedance transformation circuit can outwardly adapt the impedance of the antenna (in the reception case towards the reception amplifier or in the transmission case towards the transmission device of an MRT) to an existing reception amplifier or an existing transmission device.

A characteristic impedance of the conductor that is selected to be higher leads to a more advantageous efficiency of the antenna in the transmission case and to a higher signal-to-noise ratio in the reception case. Due to the higher selected characteristic impedance of the antenna element, the distance between forward conductor and return conductor can be increased, which increases the field reflux space. A foamed dielectric with a lower epsilon that simultaneously also exhibits lower losses can likewise be used between forward conductor and return conductor.

According to one embodiment variant of the invention, the antenna element is designed in 200 ohm configuration. This requires one or two adaptation elements with a transformation ratio of 1:4 or, respectively, 4:1 for the adaptation of the antenna element with a characteristic impedance of 200 ohms. This would surely initially, apparently entail a limitation of the broadband capability of the system. However, the technical possibility exists to design the adaptation units as broadband transformers in Guanella or Ruthroff design, even without using ferrite materials, even if admittedly the originally unlimited, designed-dependent broadband capability of the 50 ohm antenna element cannot be achieved again.

In a further embodiment, the antenna element (which can also be designed as a stripline structure) can have a characteristic impedance that is not hard-set. In general, this characteristic impedance that is not hard-set or is not defined in detail will be higher than 30 or 50 ohms but lower than 300 ohms for technical feasibility reasons. The adaptation of this antenna element to the 50 ohms of the MR system is achieved by an advantageously variable adapter unit or an adjustable transformation relationship of the adapter unit (also called an impedance transformation circuit in the following) is provided.

The adapter unit can but does not need to be variable. The variability of the adapter unit would serve to optimally adapt the transmission line in the loaded state to the 50 ohm impedance of the MRT system. Due to a rise of the efficiency and due to the increase of the penetration depth of the evanescent field of the transmission line in the load to be imaged (body of the patient), it is to be assumed that the impedance of the transmission line in the loaded case will differ significantly from its unloaded characteristic impedance, and primarily in that it will no longer exhibit only purely resistive (ohmic) portions, but rather also reactive portions. To compensate these reactive portions, and in a further step to adapt the resulting ohmic active impedance to the 50 ohm system impedance depending on the load state, a variable adapter unit can be used. Because the requirement for broadband capability can thereby no longer be assumed without limitation, the broadband of the resulting system can be maximal, or the properties of multiple resonant adaptation networks can be utilized for special spectroscopic applications.

Advantages of the invention are an increase of the efficacy both with regard to the energy balance and with regard to the field structure, penetration depth and antenna characteristic with a characteristic impedance higher than 50 ohms while largely retaining the advantages of non-resonant antennas in 50 ohm engineering with simplicity in the manufacture and handling and an optimally high bandwidth. Further advantages are an improvement of the field structure, penetration depth and antenna characteristic, and a significant retention of the advantages of non-resonant antennas in general.

An adaptation of the characteristic impedance of the antenna element to the posed task can be provided. For some tasks, a characteristic impedance of 200 ohms with a fixed transformation to the 50 ohm system impedance (of MRT elements that are/can be connected with the antenna) could appear to be advantageous. For some other tasks, an additional characteristic impedance of the antenna element (that is not defined in detail) could be advantageous, wherein at the same time the reactive portions of the impedance that result due to the load could also be compensated by a variable adapter unit.

DESCRIPTION OF THE PREFERRED EMBODIMENTS

Figure 1:
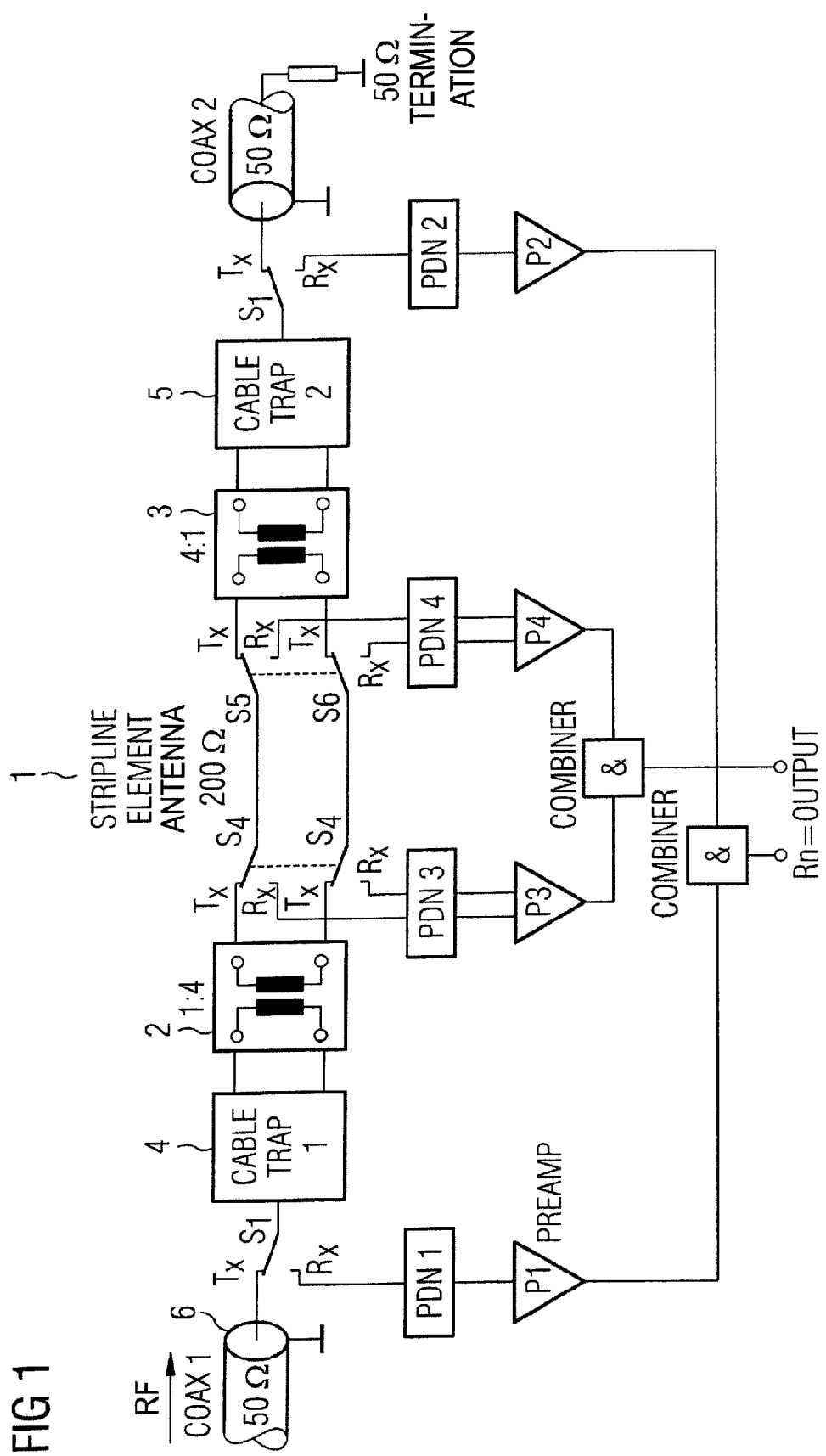
FIG. 1 shows an antenna with 200 ohm impedance and adapter elements with a transformation ratio of 1:4.

According to one embodiment (stripline antenna element with a characteristic impedance of 200 ohms and a 1:4 impedance transformation) of the invention according to FIG. 1 (A1), an antenna element 1 (here a stripline antenna element) exhibits a characteristic impedance of 200 ohms, wherein the antenna element is adapted to the MR system impedance (one of the MRT system) of 50 ohms via a 1:4 transformation element "2" and a 4:1 transformation element "3". Stripline (or strip line) antennas can be fashioned, for example, planar or flat or arbitrarily otherwise.

Common mode chokes 4 (cable trap 1) and 5 (cable trap 2) serve for the symmetry transformation and avoiding ground loops or to damp (as sheath wave barrier elements) a sheath wave creation.

In the transmission case (when switches S1, S2, S3, S4, S5 and S6 are in the Tx position), radio-frequency energy RF is fed from the left side in FIG. 1 through the 50 ohm coaxial connection 6. The cable trap 1 make the feed line symmetrical. The 1:4 transformation element 2 transforms the 50 ohm impedance of the feed system 6 to the 4-times higher characteristic impedance of the open transmission line that serves as an antenna (Stripline element antenna 200 ohm designated 1 in the middle of FIG. 1) and is connected to the middle, common terminals of the switches S3 and S4.

At the other, right side of the antenna 6, the aforementioned components are connected to the Tx terminals of the switches S5 and S6 in the reverse order. First a 4:1 transformer that transforms the 200 ohms (of the antenna) down to 50 ohms, then a standing wave barrier and (via the Tx position of the S2 switch) a further coaxial connection that leads to a load resistance of 50 ohms. This coaxial connection can thereby be very short or even be omitted altogether. The 50 ohm load resistance at this point is provided for the impedance-matched termination of the transmission line and is dimensioned such that it can possibly transduce the entire available transmission power of the amplifier into heat.

The components on the right side of the antenna element (to the right of the Tx terminals of the switches S5 and S6) can alternatively be replaced with a large, 200 ohm load resistance. This significantly simplifies the design but prevents the use of the additional receiver channel that goes from the Rx terminal of the switch S2 through the preamplifier P2 to the MR system.

In reception mode, all switches S1, S2, S3, S4, S5 and S6 are brought into the Rx position. Moreover, not all switches are thereby necessary; rather, they represent alternative reception possibilities: either the use of the switches S1 and S2 or the use of the switches S3 through S6 is alternatively possible.

Switches S1 and S2:

First the reception situation with the switches S1 and S2 is described: the 200 ohm antenna element 1 is directed via the Rx terminals of the switches S1 and S2 to both sides at the preamplifiers P1 and P2, respectively. In a first variant, the elements PDN1 and PDN2 are omitted. In this variant, the preamplifiers P1 and P2 have an input impedance of 50 ohms and thus form an impedance-matched termination of the antenna (whose outward impedance was transformed down to 50 ohms).

The elements PDN (PDN1, PDN2, PDN3, PDN4), known as the "preamp decoupling networks" (preamplifier decoupling network elements) PDN1 and PDN2, form a further alternative. Via these a preamplifier decoupling is generated that serves to minimize the currents induced in the antenna in the reception case and to simultaneously achieve a maximum signal-to-noise ratio. One disadvantage of this method could be that it would limit the broadband capability of the arrangement unless separate PDN and P elements for every frequency in question were to be used that could be switched or could be alternately exchanged.

Via the optional combiner, the signals of the two preamplifiers are superimposed with accurate phase and directed to the receiver system of the MR system for additional evaluation (Rx output).

Switches S3, S4, S5 and S6:

In this case S1, S2 and the connected preamplifiers P1 and P2 are not present and also not necessary.

First a use without the preamplifier decoupling elements PDN3 and PDN4 is explained. The preamplifiers P3 and P4 have input impedances of 200 ohms and therefore terminate the antenna on both sides with correct impedance. The ratios are similar to the previous case with the exception of the detail that the preamplifiers used here are designed symmetrically and thereby suppress possibly occurring common mode interferences effectively and in broadband—without the necessity of sheath wave barrier, as in the previous case.

Here as well an optional, per definition narrowband preamplifier decoupling from an increase of the signal-to-noise ratio (SNR) could serve to load the broadband capability. The combiner here likewise has the role of signal overlaying, and as in the previously discussed example a portion of the arrangement (S5, S6, PDN4 and P4) can be replaced with a load resistance of 200 ohms to minimize the circuit cost given a loss of reception signal that is to be accepted.

Figure 2:
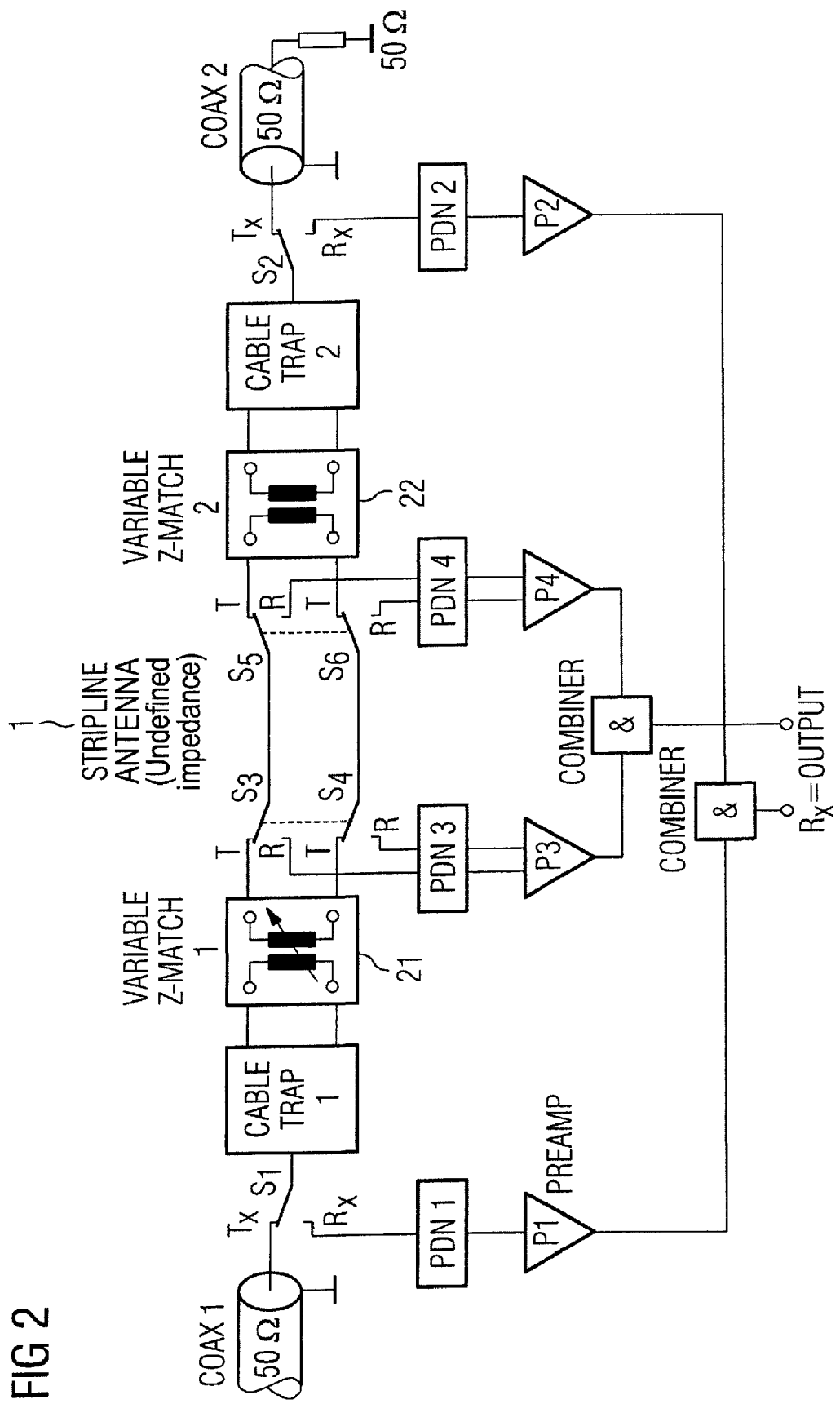
FIG. 2 shows an antenna with non-fixed impedance and adapter elements with a variable transformation ratio.

An additional embodiment variant of the invention according to FIG. 2 (stripline antenna element with an arbitrary impedance and a variable impedance transformation) differentiates from that previously described in that the characteristic impedance of the open transformation line (that represents the antenna element) is not defined in detail. This freedom is advantageous in order to optimally design the antenna for special application cases, wherein a different impedance in the range from 30 to 300 ohms would be advantageous from case to case for the optimization of one or more criteria.

Optimization criteria can be, for example:
Energy balance (efficiency) in the transmission case
Local and/or global SAR exposure of the patient
Signal-to-noise ratio in the reception case
Broadband capability
Special spectroscopic requirements
Costs
Circuit complexity
Compatibility with additional coils
Array formation Moreover, in this variant the influence of the load (due to a patient etc.) that is to be imaged can be accounted for in the adaptation of the impedance and even dynamically compensated due to the adjustment capability of the adaptation and transformation elements (also designated as "variable Z-match") 21/22. Optimal relationships with regard to the impedance adaptation are thereby achieved with regard to loading of the broadband capability of the system. In this case as well multiple frequencies can be covered simultaneously by using doubly- and multiply-resonant adaptation elements.

Figure 3:
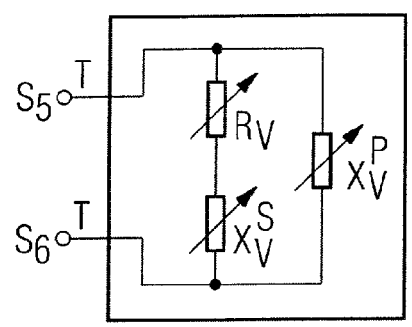
FIG. 3 shows an alternative termination for the arrangement in FIG. 2.

The switching behavior of the switches S1 through S6 and the properties of each variant (S1 and S2 or S3 through S6) are analogous to those previously described for the cases in FIG. 1. As a separate alternative, according to FIG. 3 the mounting (placement) to the right of the switches S5 and S6 (instead of the element 22) is possible with an adjustable termination consisting of the elements $R_V$ (impedance), $X_V^S$ (adjustable coil) and $X_V^P$ (adjustable coil). One example is a network (for termination) consisting of a variable load resistance and additional adjustable reactances that are arranged in series or, respectively, parallel. Arbitrary (also reactive) impedances at the S5, S6 end of the transmission line 1 should thereby be effectively adapted. It should thus be possible to also effectively compensate those variations that can result due to the loading with the imaging subject or, respectively, due to the interaction with other antennas.

The invention can be used for antennas in whole-body coils, local coil, volume coils and surface coils.

Figure 4:
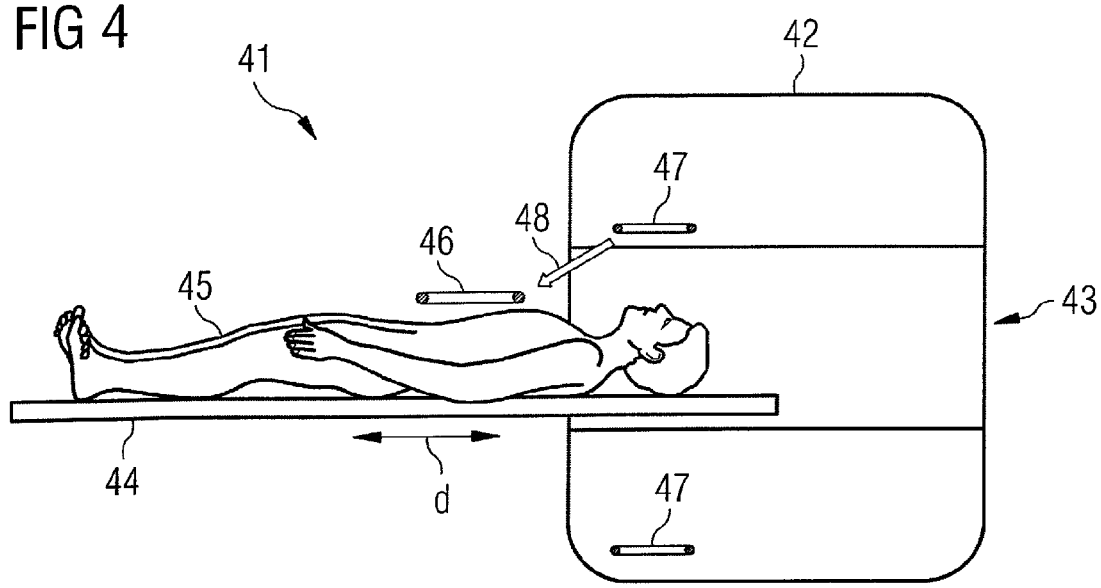
FIG. 4 schematically illustrates a magnetic resonance apparatus.

FIG. 4 shows an example where the invention can be used: FIG. 4 shows a known magnetic resonance apparatus (DIRT) 41 with a scanner 42 with a tube-shaped space 43 into which a patient bed 44 with, for example, a patient 45 and a local coil arrangement 46 can be driven in the direction of the arrow z in order to generate exposures of the patient 45. Here a local coil array 46 (with multiple local coils and channels for signals from the local coils) is placed on the patient, with which local coil array 46 good exposures are enabled in a local region, and the signals of which can be evaluated (converted into images etc.) by a known evaluation device that can be connected via coaxial cables etc. The scanner 42 has a built-in whole body coil 47. The scanner 42 is operated by a control system 49 that also evaluates the acquired data as described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna assembly for magnetic resonance tomography, comprising:
   an antenna configured to at least receive magnetic resonance signals;
   at least one impedance transformation circuit electrically connected to said antenna;
   said antenna also being configured to transmit radio-frequency signals for magnetic resonance tomography, and said antenna being connected to said impedance transformation circuit at a first side of said impedance transformation circuit; and
   said antenna assembly comprises a standing wave barrier connected to a second side of said impedance transformation circuit, a switch connected to said standing wave barrier at a side thereof opposite to said impedance transformation circuit, a feed line connected to a source of radio-frequency energy, and a reception device that receives said magnetic resonance signals, said switch being switchable between a first switch position that connects said antenna, via said impedance transformation circuit and said standing wave barrier, to said feed line, and a second position that connects said antenna, via said impedance transformation circuit and said standing wave barrier, to said reception device.

2. An antenna assembly as claimed in claim 1 comprising two impedance transformation circuits electrically connected to said antenna.

3. An antenna assembly as claimed in claim 1 wherein said impedance transformation circuit comprises a transformer.

4. An antenna assembly as claimed in claim 1 wherein said impedance transformation circuit is configured with an impedance transformation ratio selected from the ratios of 1:4 and 4:1.

5. An antenna assembly as claimed in claim 1 wherein said impedance transformation circuit is configured with an adjustable impedance transformation ratio.

6. An antenna assembly as claimed in claim 1 comprising a receiver device that receives said magnetic resonance signals, and a plurality of switches connected between said antenna, said impedance transformation circuit and said receiver, said plurality of switches being respectively switchable to switch positions to respectively connect said antenna to said transformation circuit and to connect said antenna to said receiver device.

7. An antenna assembly as claimed in claim 1 comprising a standing wave barrier connected to said impedance transformation circuit at a side of said impedance transformation circuit opposite to a side of said impedance transformation circuit connected to said antenna.

8. An antenna arrangement as claimed in claim 1 comprising a first plurality of switches connected between said antenna and said impedance transformation circuit and said receiver device, said first plurality of switches being switchable between a first switching position that connects said antenna to said impedance transformation circuit and a second switching position that connects said antenna directly to said reception circuit, and said antenna assembly comprising an impedance termination and a second plurality of switches, said second plurality of switches being switchable between a first switching state that connects said stripline antenna to said impedance termination and a second switching position that directly connects said antenna to said reception circuit.

9. An antenna assembly as claimed in claim 1 wherein said antenna has an impedance that is greater than 50 ohms.

10. An antenna assembly as claimed in claim 1 wherein said antenna has an impedance of 200 ohms.

11. An antenna assembly as claimed in claim 1 having an output configured for connection to an external device, selected from the group consisting of a magnetic resonance signal reception device and a source of radio-frequency energy, and wherein said impedance transformation circuit is configured to adapt an impedance of the antenna to an impedance of the external device.

12. An antenna assembly as claimed in claim 1 wherein said antenna is a stripline antenna element.

13. An antenna assembly as claimed in claim 1 wherein said antenna has a fixed impedance that is other than 50 ohms, and wherein said impedance transformation circuit is configured for variable impedance transformation.

* * * * *